(12) United States Patent
Ramachandran et al.

(10) Patent No.: US 9,510,454 B2
(45) Date of Patent: Nov. 29, 2016

(54) INTEGRATED INTERPOSER WITH EMBEDDED ACTIVE DEVICES

(71) Applicant: QUALCOMM Incorporated, San Diego, CA (US)

(72) Inventors: Vidhya Ramachandran, Cupertino, CA (US); Urmi Ray, San Diego, CA (US); Ravindra Vaman Shenoy, Dublin, CA (US); Kwan-Yu Lai, Campbell, CA (US); Jon Bradley Lasiter, Stockton, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 148 days.

(21) Appl. No.: 14/463,367

(22) Filed: Aug. 19, 2014

(65) Prior Publication Data
US 2015/0250058 A1 Sep. 3, 2015

Related U.S. Application Data

(60) Provisional application No. 61/946,636, filed on Feb. 28, 2014.

(51) Int. Cl.
*H05K 1/18* (2006.01)
*H01L 21/28* (2006.01)
(Continued)

(52) U.S. Cl.
CPC ......... *H05K 1/185* (2013.01); *H01L 21/28008* (2013.01); *H01L 21/76802* (2013.01); *H01L 21/76877* (2013.01); *H01L 21/84* (2013.01); *H01L 23/147* (2013.01);
(Continued)

(58) Field of Classification Search
CPC .......... H01L 2224/16225; H01L 2224/32225; H01L 2224/73204; H01L 2924/00; H01L 2924/15311; H01L 21/28008; H01L 21/76802; H01L 21/76877; H01L 21/76898; H01L 21/84; H01L 23/5384; H01L 27/0629
See application file for complete search history.

(56) References Cited

U.S. PATENT DOCUMENTS 6,617,681 B1 9/2003 Bohr
8,455,995 B2 6/2013 Tsai et al.
(Continued)

FOREIGN PATENT DOCUMENTS

EP 1755164 A2 2/2007
JP 2006179564 A 7/2006
KR 20130075552 A 7/2013

OTHER PUBLICATIONS

International Search Report and Written Opinion—PCT/US2015/017320—ISA/EPO—May 20, 2015.

*Primary Examiner* — Yuriy Semenenko
(74) *Attorney, Agent, or Firm* — Seyfarth Shaw LLP

(57) ABSTRACT

An integrated interposer between a first component and a second component includes a substrate. The substrate may have thermal and/or mechanical properties with values lying between the thermal and/or mechanical properties of the first component and the second component. Active devices are disposed on a first surface of the substrate. A contact layer is coupled to the active devices and configured to couple at least the first component and a third component to the integrated interposer. At least one through via(s) is coupled to the contact layer and extends through the substrate to a second surface of the substrate. An interconnect layer is disposed on the second surface of the substrate and coupled to the at least one through via(s). The interconnect layer is configured to couple the second component to the integrated interposer.

16 Claims, 27 Drawing Sheets

(51) Int. Cl.
*H01L 21/768* (2006.01)
*H01L 23/538* (2006.01)
*H01L 21/84* (2006.01)
*H01L 27/06* (2006.01)
*H01L 27/12* (2006.01)
*H01L 23/14* (2006.01)
*H01L 23/498* (2006.01)
*H01L 25/065* (2006.01)

(52) U.S. Cl.
CPC .... *H01L 23/49827* (2013.01); *H01L 23/5384* (2013.01); *H01L 25/065* (2013.01); *H01L 27/0629* (2013.01); *H01L 27/0688* (2013.01); *H01L 27/12* (2013.01); *H01L 2224/16225* (2013.01); *H01L 2224/32225* (2013.01); *H01L 2224/73204* (2013.01); *H01L 2924/15311* (2013.01)

(56) References Cited

U.S. PATENT DOCUMENTS

| | | | |
|---|---|---|---|
| 8,476,735 B2 | 7/2013 | Hsu et al. | |
| 8,933,473 B1* | 1/2015 | Dubin | H01L 25/167 257/79 |
| 2009/0231820 A1 | 9/2009 | Tanaka | |
| 2010/0081236 A1 | 4/2010 | Yang et al. | |
| 2012/0087460 A1* | 4/2012 | Moriwaki | H01L 27/0255 377/64 |
| 2012/0145445 A1 | 6/2012 | Arai | |
| 2012/0248622 A1* | 10/2012 | Sadaka | H01L 21/76254 257/774 |
| 2013/0009150 A1* | 1/2013 | Inoue | H01L 23/49822 257/43 |
| 2013/0063843 A1 | 3/2013 | Chen et al. | |
| 2013/0175686 A1* | 7/2013 | Meyer | H01L 25/0655 257/738 |
| 2013/0242493 A1* | 9/2013 | Shenoy | H01L 23/49827 361/679.21 |
| 2013/0292846 A1* | 11/2013 | Lee | H01L 23/538 257/774 |

* cited by examiner

INTEGRATED INTERPOSER WITH EMBEDDED ACTIVE DEVICES

CROSS REFERENCE TO RELATED APPLICATION

The present application claims the benefit of U.S. Provisional Patent Application No. 61/946,636, filed on Feb. 28, 2014, in the names of Vidhya Ramachandran et al., the disclosure of which is expressly incorporated by reference herein in its entirety.

BACKGROUND

Field

The present disclosure generally relates to integrated circuits (ICs). More specifically, one aspect of the present disclosure relates to embedding active devices within an integrated interposer.

Background

The process flow for semiconductor fabrication of integrated circuits (ICs) may include front-end-of-line (FEOL), middle of line (MOL), and back-end-of-line (BEOL) processes. The FEOL process may include wafer preparation, isolation, well formation, gate patterning, spacer, extension and source/drain implantation, silicide formation, and dual stress liner formation. The MOL process may include gate contact formation. Middle of line layers may include, but are not limited to, MOL contacts, vias or other layers within close proximity to the semiconductor device transistors or other like active devices. The BEOL processes may include a series of wafer processing steps for interconnecting the semiconductor devices created during the FEOL and MOL processes. Successful fabrication of modern semiconductor chip products involves an interplay between the materials and the processes employed.

Various challenges arise when designing an advanced node at or below, for example, sixteen (16) nanometers. For example, reducing die size is important for containing cost while improving yield due to the advanced node scaling. Passives and input/output (I/O) devices may take up significant space on the die of a system on chip (SoC). Although the passives and I/O devices increase the die size, these devices may not involve advanced node processing, and thus become a source of added cost and complexity. For example, at ten (10) nanometers, suppliers are debating whether to include 1.8 volt (V) I/O devices in their technology offerings. Unfortunately, many I/O technologies continue to operate at 1.8 V.

SUMMARY

An integrated interposer between a first component and a second component includes a substrate. The substrate may have thermal and/or mechanical properties with values lying between the thermal and/or mechanical properties of the first component and the second component. Active devices are disposed on a first surface of the substrate. A contact layer is coupled to the active devices and configured to couple at least the first component and a third component to the integrated interposer. At least one through via(s) is coupled to the contact layer and extends through the substrate to a second surface of the substrate. An interconnect layer is disposed on the second surface of the substrate and coupled to the at least one through via(s). The interconnect layer is configured to couple the second component to the integrated interposer.

An integrated interposer between a first component and a second component includes a substrate. The substrate may have thermal and/or mechanical properties with values lying between the thermal and/or mechanical properties of the first component and the second component. Active devices are disposed on a first surface of the substrate. A contact layer is coupled to the active devices and configured to couple at least the first component and a third component to the integrated interposer. The integrated interposer further includes means for coupling the contact layer through the substrate to the interconnect layer on the second surface of the substrate.

A method of fabricating an integrated interposer includes fabricating active devices on a first surface of an interposer substrate. The method also includes opening a contact layer to the active devices on the first surface of the interposer substrate. The method further includes plating a conductive material in at least one opening(s) in the contact layer and at least one via opening(s) on the first surface of the interposer substrate and extending through the interposer substrate to a second surface of the interposer substrate to couple at least one die(s) to the integrated interposer. The method also includes forming an interconnect layer on the second surface of the interposer substrate and coupled to the contact layer through the conductive material in the least one via opening(s).

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
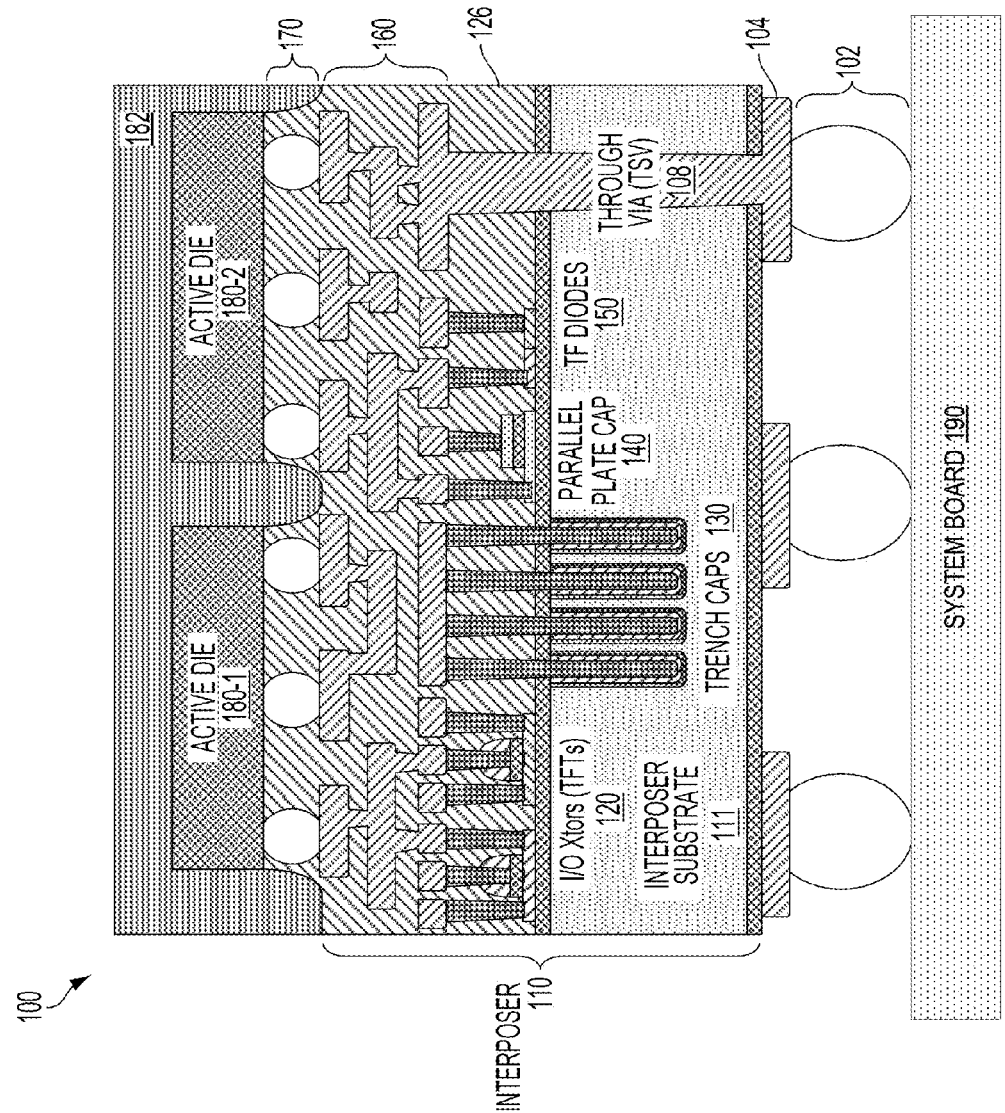
FIG. 1 shows a cross-sectional view illustrating a system on chip including an integrated interposer with thin film active devices and passive devices within a semiconductor substrate of the integrated interposer according to one aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Some described implementations relate to interposer technology. An interposer generally serves as an intermediate layer that can be used for direct electrical interconnection between one component or substrate and a second component or substrate with the interposer positioned in between. For example, an interposer may have a pad configuration on one side that can be aligned with corresponding pads on a first component, and a different pad configuration on a second side that corresponds to pads on a second component. In one aspect of the present disclosure, an interposer substrate has thermal and/or mechanical properties with values lying between the thermal and/or mechanical properties of the first component and the second component. The interposer substrate can be composed of glass and quartz, organic, or other like material. The thermal and/or mechanical properties are tunable in this configuration.

The interposer can contain electrical traces that allow interconnecting pads to be aligned and mated to devices on opposite sides. In some implementations, the interposer includes an interposer layer that has electrically conductive interconnects (vias) extending through the interposer layer. For example, in one configuration, the interposer layer can include an interposer substrate having a through glass via. In another configuration, the substrate interposer includes a predrilled via opening as a starting point for fabrication of the interposer. The via opening of the substrate interposer can be predrilled and prefilled. The interposer can further include one or more routing or redistribution layers. In one aspect of the present disclosure, one or more thin film active devices are embedded within an integrated interposer. These thin film active devices can be organic. In some configurations, one or more devices may be attached to each side of the integrated interposer.

Various aspects of the disclosure provide techniques for embedding active devices and passive devices within an integrated interposer. The process flow for semiconductor fabrication of an integrated interposer may include front-end-of-line (FEOL) processes, middle of line (MOL) processes, and back-end-of-line (BEOL) processes. It will be understood that the term "layer" includes film and is not to be construed as indicating a vertical or horizontal thickness unless otherwise stated. As described herein, the term "substrate" or "interposer substrate" may refer to a substrate of a diced wafer or may refer to the substrate of a wafer that is not diced. Similarly, the terms wafer and die may be used interchangeably unless such interchanging would tax credulity.

According to one aspect of the disclosure, an integrated interposer with a glass, quartz or organic substrate includes embedded electrostatic detection (ESD) diodes and/or I/O transistors. The active device may be fabricated based on low cost thin film technology. The active device may be arranged with passive devices to enable removal of I/O circuits, ESD protection and passive devices from an active die. This configuration enables the combination of an active die for targeted (e.g., high performance) technologies for each system functionality (processor, modem, memory, etc.), while the integrated interposer is used to provide the other functionality (e.g., die interconnection, system ESD protection, embedded passives, I/O circuits) and interconnection to a system board. In this arrangement, the substrate interposer exhibits thermal and/or mechanical properties with values between the thermal and/or mechanical properties of the active die and the system boards.

FIG. 1 show a cross-sectional view illustrating a system on chip (SoC) 100 having an integrated interposer 110 including thin film active devices and passive devices within an interposer substrate 111 of the integrated interposer 110 according to one aspect of the disclosure. Representatively, the SoC 100 includes a semiconductor substrate (e.g., a silicon wafer) 111 having passive devices (e.g., trench capacitors 130). A passivation layer 126 is disposed on the interposer substrate 111 including the active devices (e.g., I/O transistors (Xtors) 120) and diodes 150. The passivation layer 126 also includes passive devices (e.g., trench capacitors 130 and a parallel plate capacitor 140). In addition, active die 180 (180-1, 180-2) are coupled to the integrated interposer 110 through a second set of interconnects 170. One process for forming the active and passive devices is shown in the process of FIG. 2.

Figure 2:
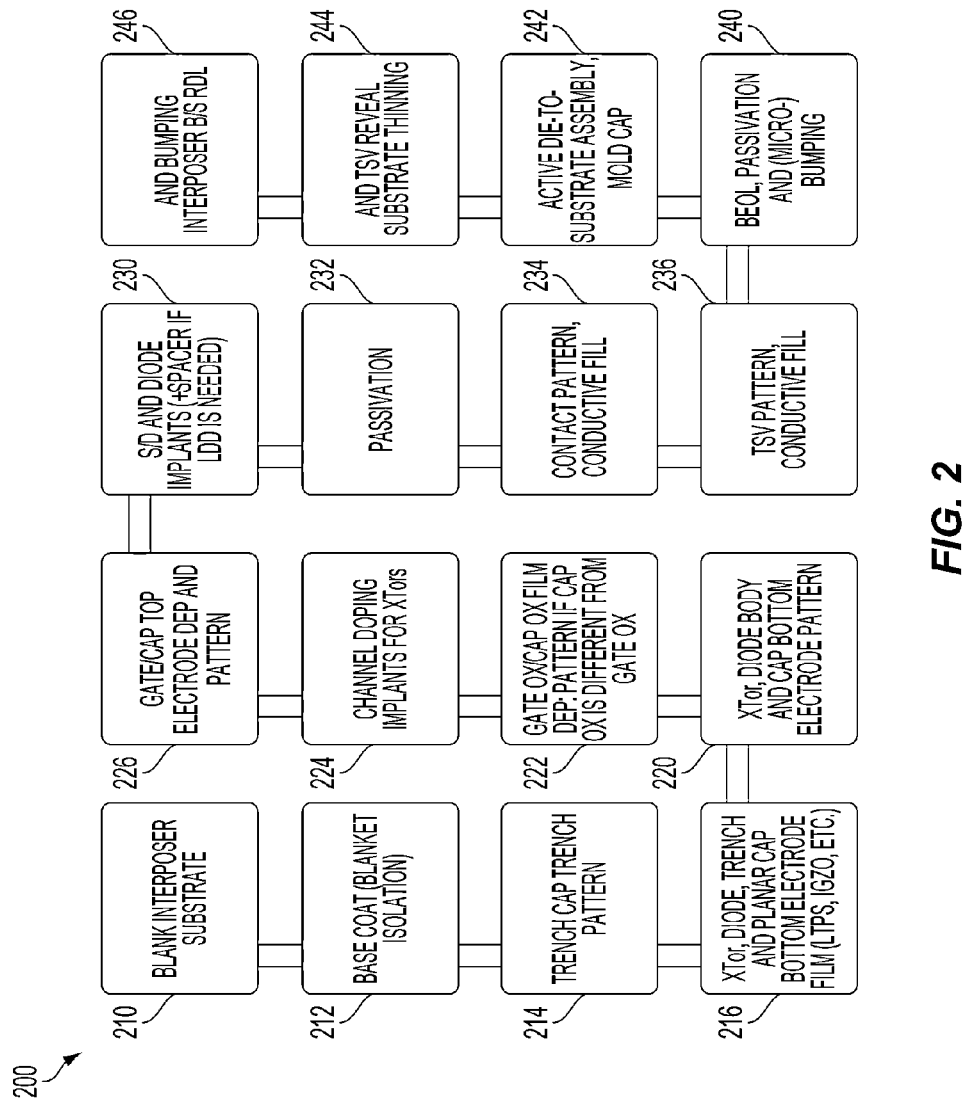
FIG. 2 is a block diagram illustrating a method for fabricating the integrated interposer of the system on chip shown in FIG. 1, according to one aspect of the disclosure.

FIG. 2 is a block diagram illustrating a method 200 for fabricating the integrated interposer 110 of the system on chip shown in FIG. 1, according to one aspect of the disclosure. Representatively, the method 200 involves a through substrate via (TSV) pattern and reveal process for fabrication of a silicon interposer, for example, as shown in FIG. 1. In process blocks 210 and 212, a base coat is deposited on a blank interposer substrate. In process block 214, a trench of a trench capacitor (e.g., the trench capacitors 130) is patterned. The deposition of a thin film on the interposer substrate (e.g., the interposer substrate 111) is performed at process block 216. The patterning of the thin film on the interposer substrate (e.g., the interposer substrate 111) to form a patterned thin film is performed in process block 220. The deposition of a gate oxide is performed in process block 222. The optional implanting of the capacitor electrodes to form implanted electrodes is performed in process block 224. The deposition of gate electrodes, doping and etching of the gate oxide is performed in process blocks 226 to 230. The formation of the active and passive devices is performed during process blocks 210 to 230 of FIG. 2.

Deposition of a passivation layer (e.g., the passivation layer 126) on the interposer substrate (e.g., the interposer substrate 111) including active devices (e.g., I/O transistors (Xtors) 120) and diodes 150 is performed in process block 232. In this configuration, the passivation layer 126 also includes passive devices (e.g., trench capacitors 130 and parallel plate capacitor 140).

In this configuration, a contact layer 160 coupled to the active and passive devices is formed on the passivation layer 126. The process for forming the contact layer is shown in process block 234. The contact layer 160 is coupled to a redistribution layer 104 through a through via 108. The process for forming the through via is shown in process block 236. In this configuration, a first set of interconnects 102 couples a system board 190 to the integrated interposer 110. As noted above, the active die 180 (180-1, 180-2) are coupled to the integrated interposer 110 through the second set of interconnects 170. The process for completing formation of the SoC 100 is shown in process blocks 240 to 246. Etching of the interposer substrate (e.g., the interposer substrate 111) to reveal a via opening (e.g., a through via 108 is performed in process block 244.

Active die-to-substrate assembly deposition of over molding is performed in process block 242. As shown in FIG. 1, over molding 182 is provided on the active die 180. Although described with reference to the system board 190, it should be recognized that the first set of interconnects 102 may couples a printed circuit board (PCB), a package substrate or other like carrier substrate to the integrated interposer 110.

Figure 3:
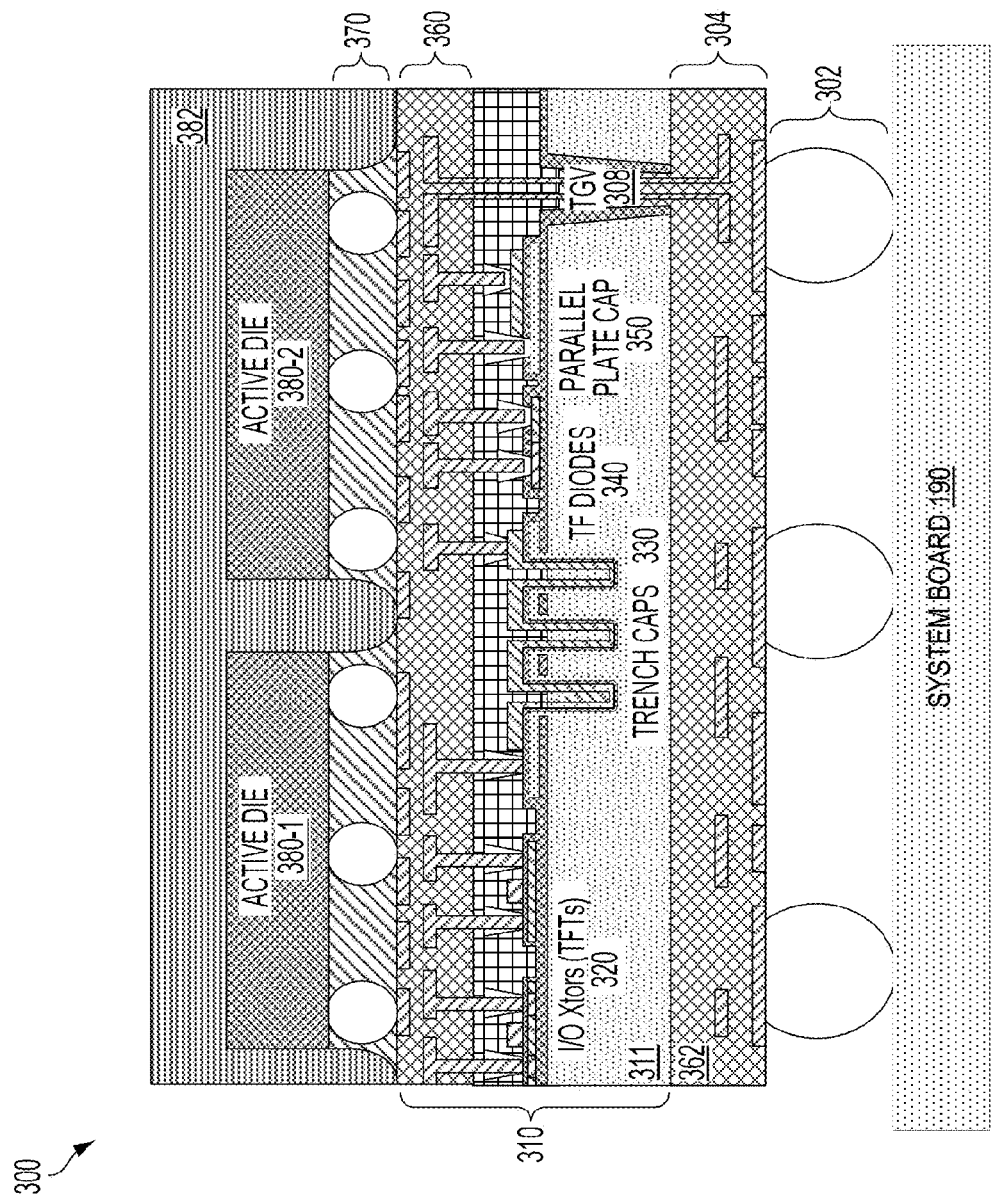
FIG. 3 shows a cross-sectional view illustrating a system on chip including an integrated interposer including thin film active devices and passive devices within a pre-drilled interposer substrate of the integrated interposer according to one aspect of the disclosure.

FIG. 3 shows a cross-sectional view illustrating a system on chip (SoC) 300 including an integrated interposer 310 according to one aspect of the present disclosure. In this configuration, thin film active devices and passive devices are within an interposer substrate 311 having a predrilled via opening. Representatively, the SoC 300 includes the interposer substrate 311 (e.g., glass, quartz, organic, or other like material) having passive devices (e.g., trench capacitors 330 and a plate capacitor 350). In this configuration, a first set of interconnects 302 couples a system board 190 to the integrated interposer 310. In addition, active die 380 (380-1, 380-2) are coupled to the integrated interposer 310 through a second set of interconnects 370.

In one aspect of the present disclosure, an interposer substrate 311 has thermal and/or mechanical properties with values lying between the thermal and/or mechanical properties of a first component (e.g., the active die 380) and a second component (e.g., the system board 190). The interposer substrate 311 can be composed of glass, quartz, organic, or other like material. The thermal and/or mechanical properties are tailored for improved performance in this configuration.

The integrated interposer 310 can contain electrical traces that allow interconnecting pads to be aligned and mated to devices on opposite sides. In some implementations, the integrated interposer 310 includes a layer that has electrically conductive interconnects (vias) extending through the layer. For example, in one configuration, the integrated interposer can include an interposer substrate having a through glass via. In another configuration, the interposer substrate includes a predrilled via opening. The integrated interposer can further include one or more routing or redistribution layers. In one aspect of the present disclosure, one or more thin film active devices are embedded within the integrated interposer. These thin film active devices can be organic. In some configurations, one or more devices may be attached to each side of the integrated interposer.

Figure 4:
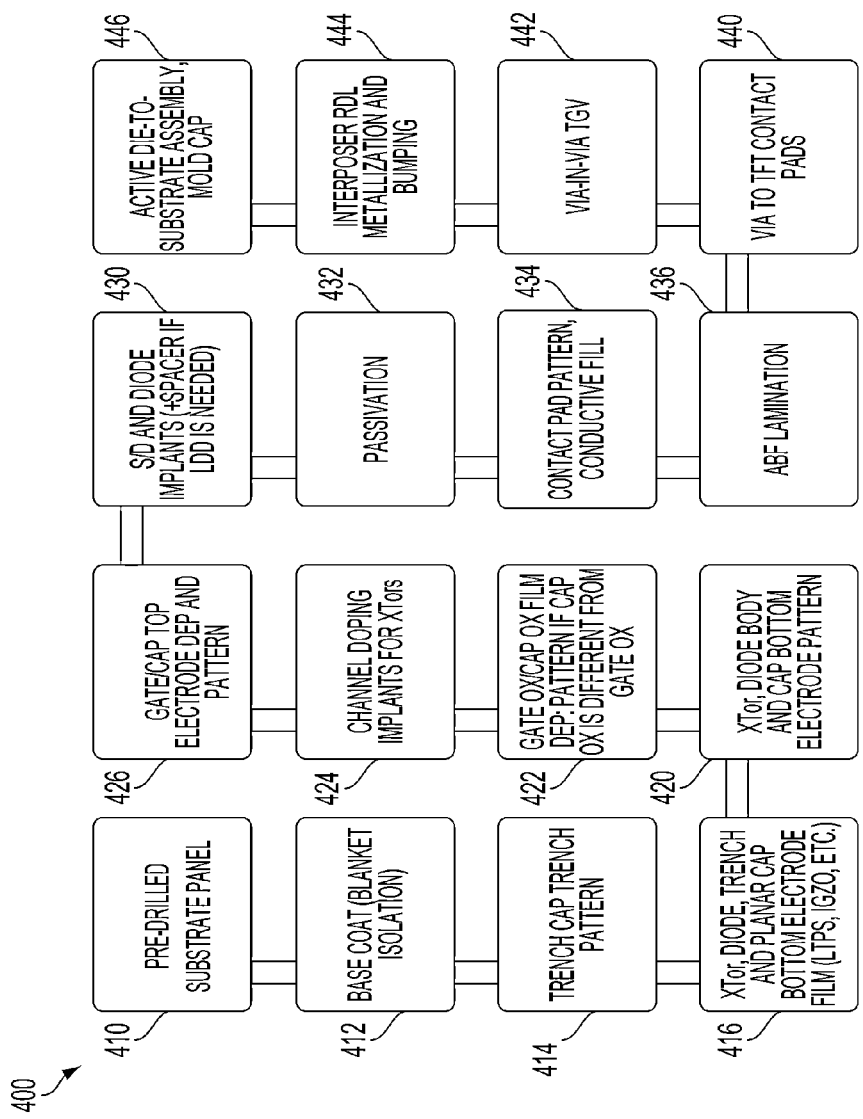
FIG. 4 is a block diagram illustrating a method for fabricating the integrated interposer of FIG. 3, according to one aspect of the disclosure

FIG. 4 is a block diagram illustrating a method 400 for fabricating the integrated interposer 310 of the system on chip (SoC) 300 shown in FIG. 3, according to one aspect of the disclosure. This process is also further illustrated in FIGS. 7 to 20.

Figure 5:
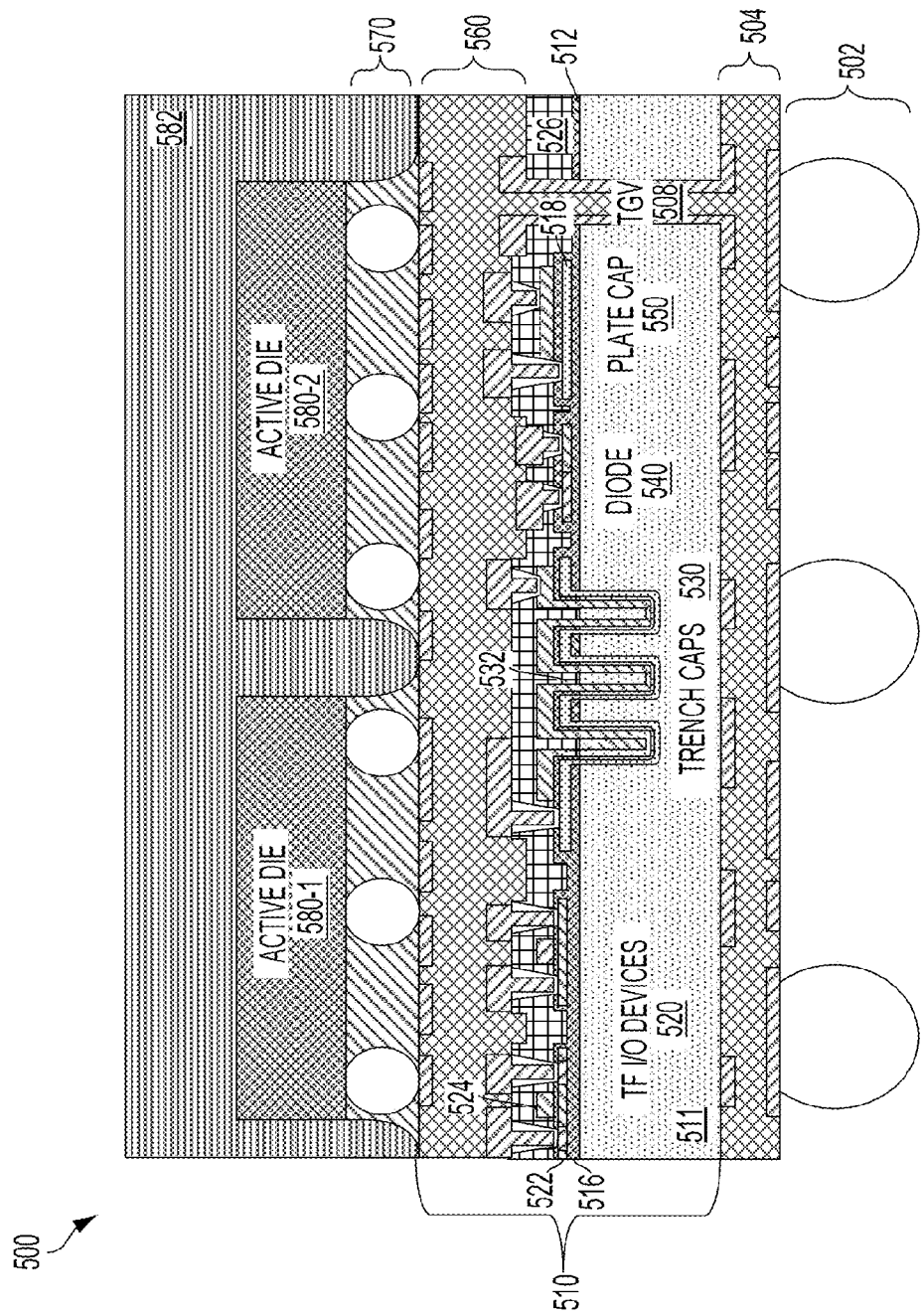
FIG. 5 shows a cross-sectional view illustrating a system on chip including an integrated interposer including thin film active devices and passive devices within an interposer substrate of the integrated interposer according to one aspect of the disclosure.
Figure 7:
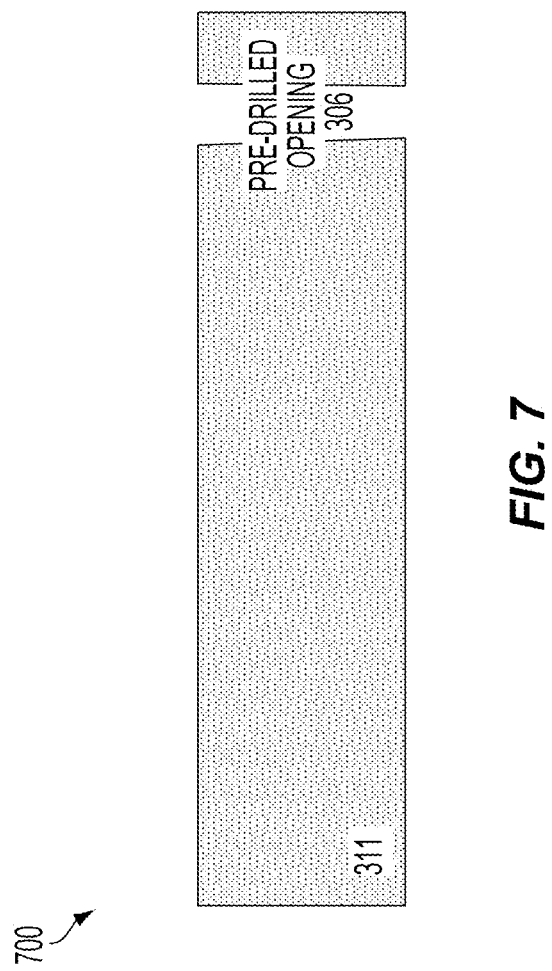
FIG. 7 shows a cross-sectional view illustrating the predrilled interposer substrate of FIG. 3 according to one aspect of the disclosure.
Figure 8:
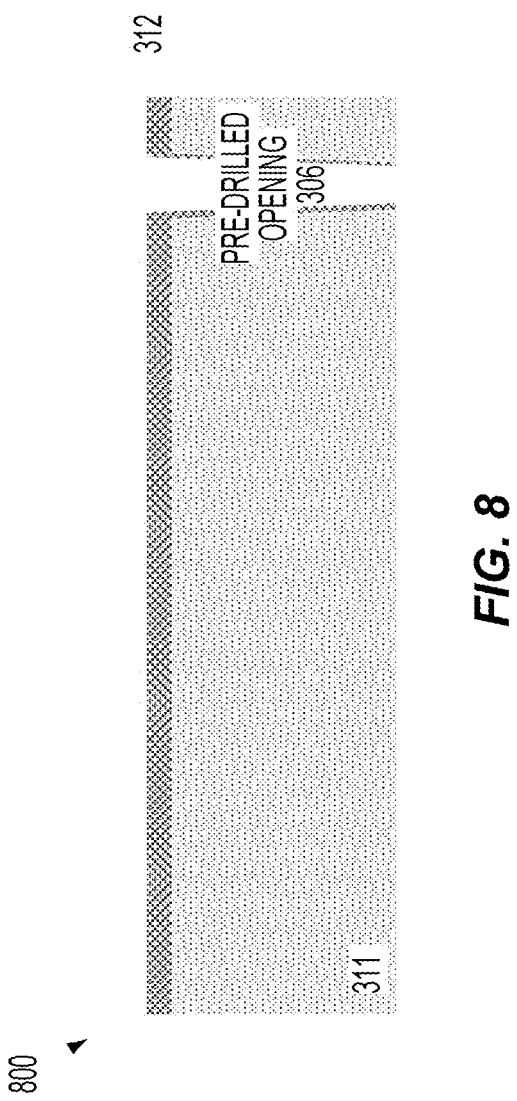
FIG. 8 shows a cross-sectional view illustrating the predrilled interposer substrate of FIG. 7 after deposition of a base coat according to one aspect of the disclosure.

The interposer substrate 311 including a predrilled opening 306 is provided at process block 410 of FIG. 4. FIG. 7 shows a cross-sectional view 700 illustrating the interposer substrate 311 of FIG. 3 including the predrilled opening 306. In another configuration, for example, as shown in FIG. 5, an interposer substrate 511 does not include a predrilled opening. The application of a base coat on the interposer substrate and in the predrilled opening is performed at process block 412 of FIG. 4. FIG. 8 shows a cross-sectional view 800 illustrating the interposer substrate 311 including the predrilled opening 306 of FIG. 7 after deposition of a base coat 312.

Figure 9:
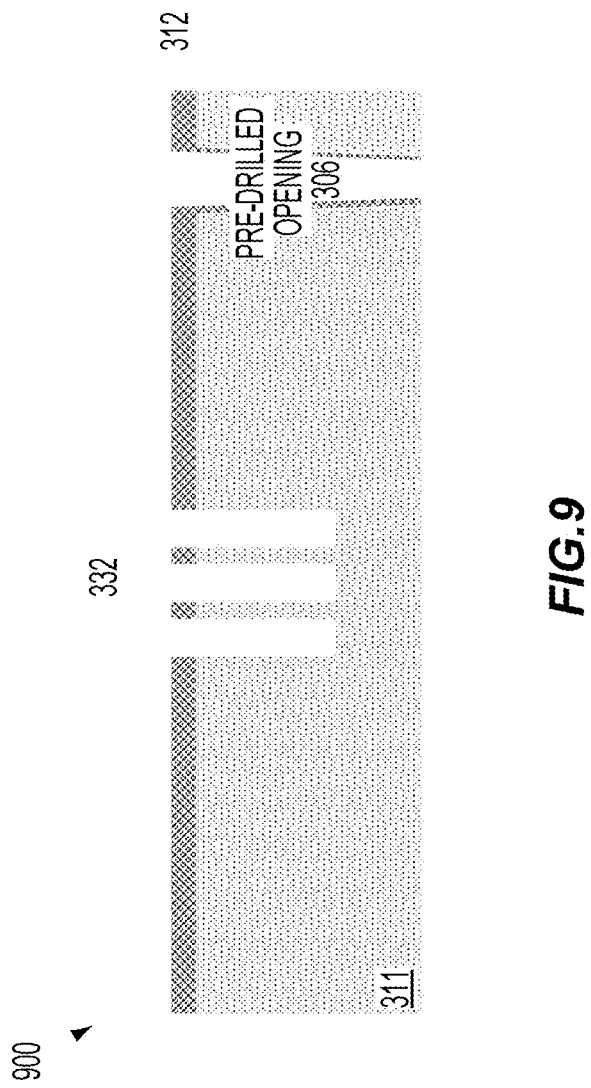
FIG. 9 shows a cross-sectional view illustrating the predrilled interposer substrate of FIG. 8 after an optional capacitor trench etch according to one aspect of the disclosure.
Figure 10:
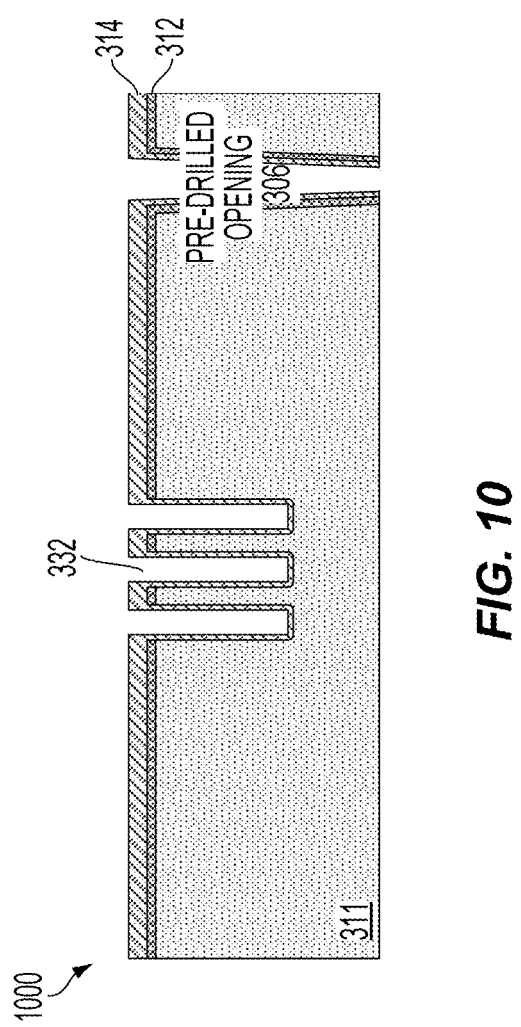
FIG. 10 shows a cross-sectional view of the predrilled interposer substrate of FIG. 9 after a thin film deposition according to one aspect of the disclosure.

The patterning of trench capacitor openings within the interposer substrate is performed at process block 414 of FIG. 4. FIG. 9 shows a cross-sectional view 900 illustrating the interposer substrate 311, including the predrilled opening 306 of FIG. 8, after a capacitor trench etch to form trench capacitor openings 332 within the interposer substrate 311. The capacitor trench etch to form trench capacitor openings 332 within the interposer substrate 311 can be performed using a laser drill or other like process for providing the trench capacitor openings 332. The deposition of a thin film on the interposer substrate and in the predrilled opening is performed at process block 416 of FIG. 4. FIG. 10 shows a cross-sectional view 1000 of the interposer substrate 311, including the predrilled opening 306 of FIG. 9, after deposition of a thin film 314. In this arrangement, the thin film 314 is deposited on the base coat 312 and within the trench capacitor openings 332. The thin film 314 may be a low-temperature polycrystalline silicon (LTPS) material, an indium gallium zinc oxide (IGZO) material, or other like thin film material.

Figure 11:
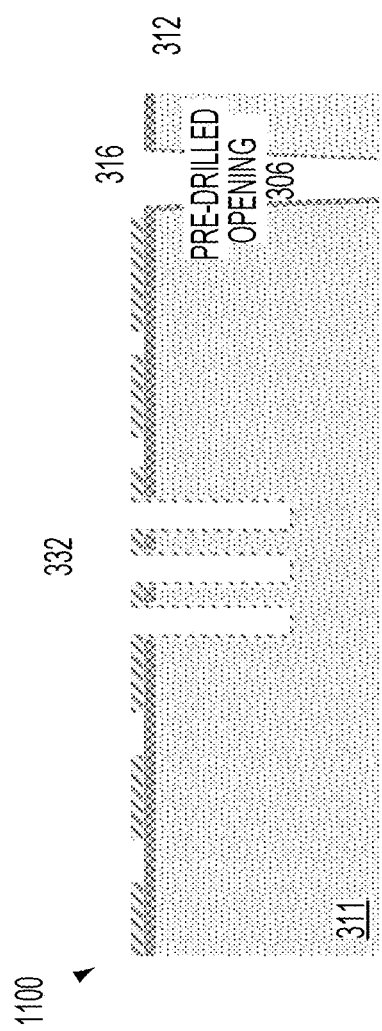
FIG. 11 shows a cross-sectional view of the predrilled interposer substrate of FIG. 10 after thin film patterning according to one aspect of the disclosure.
Figure 12:
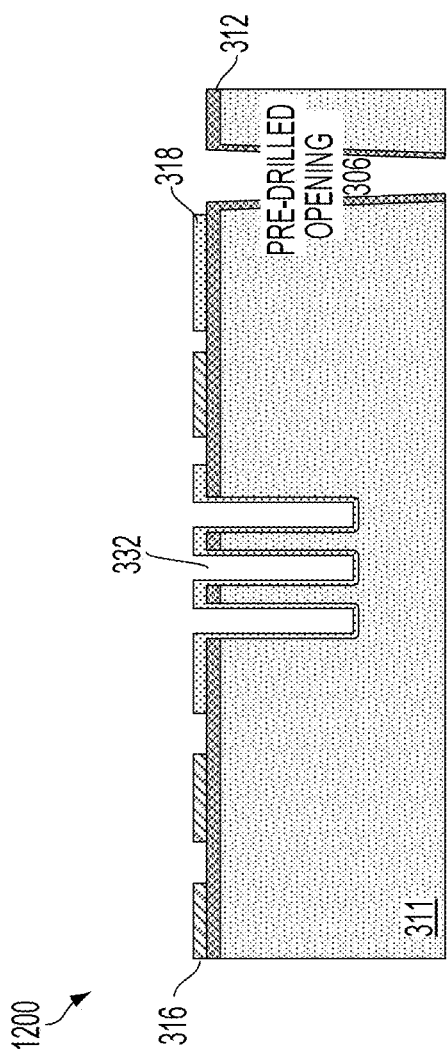
FIG. 12 shows a cross-sectional view of the predrilled interposer substrate of FIG. 11 after optional capacitor electrode implanting according to one aspect of the disclosure.

The patterning of the thin film on the interposer substrate to form a patterned thin film layer is performed at process block 420 of FIG. 4. FIG. 11 shows a cross-sectional view 1100 of the interposer substrate 311 of FIG. 10 after patterning of the thin film 314 to form a patterned thin film 316. The implanting of the capacitor electrodes to form the implanted electrodes 318 is shown in the cross-sectional view 1200 of FIG. 12. In another configuration, the thin film 314 may include the specified electrical properties without implanting. Alternatively, a deposition and etching of a highly conductive electrode material can be performed.

Figure 13:
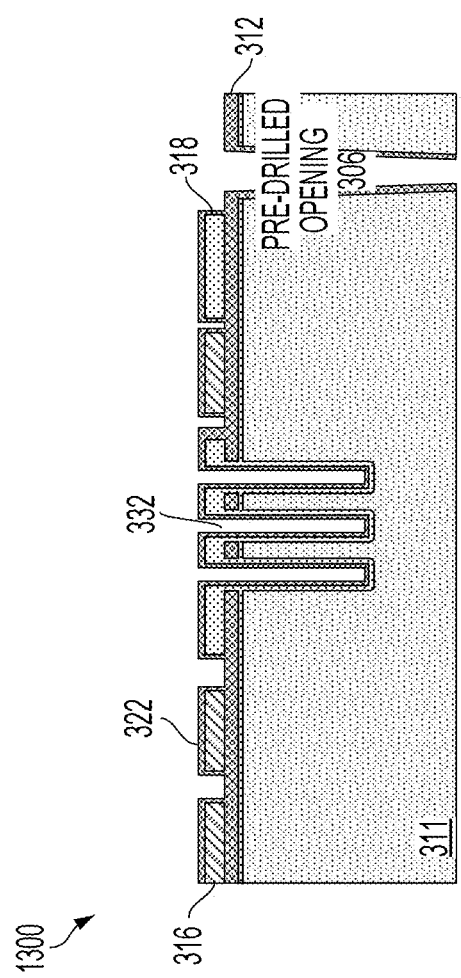
FIG. 13 shows a cross-sectional view illustrating the predrilled interposer substrate of FIG. 12 after deposition of a gate oxide according to one aspect of the disclosure.

At process block 422 of FIG. 4, a gate oxide is deposited on the interposer substrate. FIG. 13 is a cross-sectional view 1300 illustrating deposition of the gate oxide 322 on the interposer substrate 311 of FIG. 12. In this configuration, the gate oxide 322 is deposited on the patterned thin film 316, the implanted electrodes 318 and within the trench capacitor openings 332. The gate oxide 322 can serve as a capacitor oxide. Alternatively, the gate oxide 322 can be removed from the capacitors and replaced with a different material and/or a different thickness of the gate oxide 322.

Figure 14:
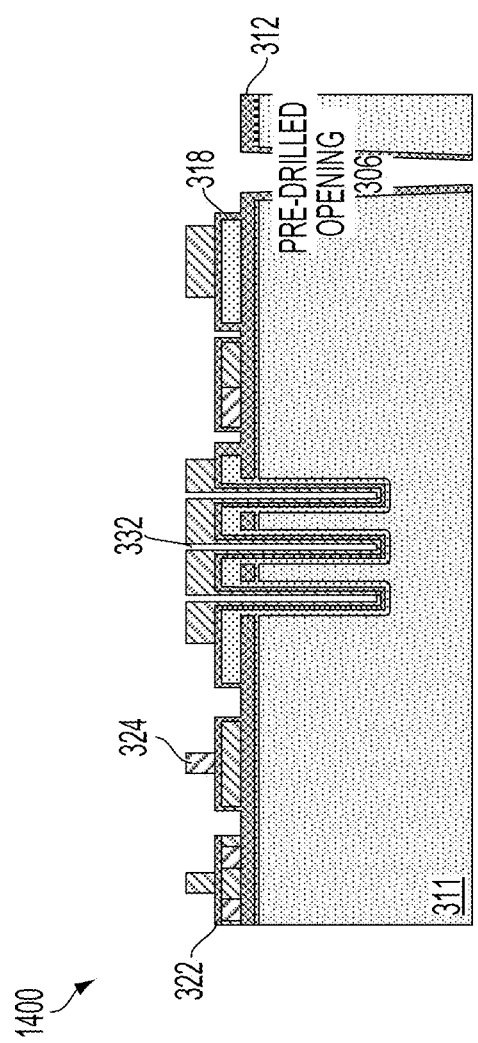
FIG. 14 shows a cross-sectional view illustrating the predrilled interposer substrate of FIG. 13 after gate electrode deposition, doping and etching according to one aspect of the disclosure.
Figure 15:
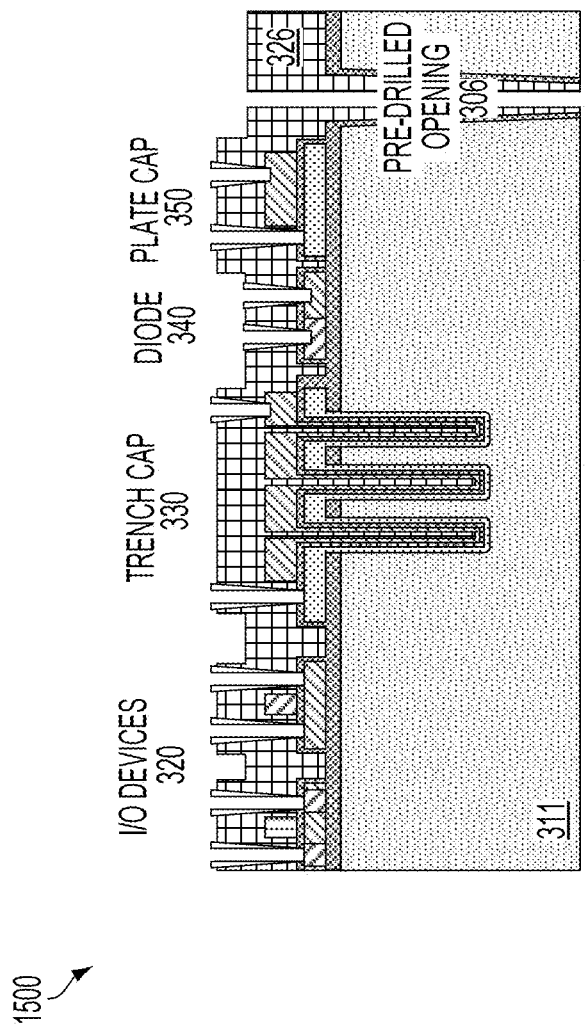
FIG. 15 shows a cross-sectional view illustrating the predrilled interposer substrate of FIG. 14 after passivation deposition and opening of a contact layer according to one aspect of the disclosure.

Referring again to FIG. 4, at process block 424 channel doping and implanting is performed. FIG. 14 is a cross-sectional view 1400 illustrating channel doping and implanting of the active devices (e.g., I/O transistors (Xtors) 320) and diodes 340. This is followed by deposition of the gate electrodes 324, including doping and etching of the gate oxide 322. (See process blocks 426 to 430 of FIG. 4.) FIG. 15 is a cross-sectional view 1500 illustrating deposition of a passivation layer 326 on the interposer substrate 311 including the active devices (e.g., I/O transistors (Xtors) 320) and diodes 340. The passivation layer 326 also includes passive devices (e.g., trench capacitors 330 and the plate capacitor 350). (See process block 432 of FIG. 4.) The passive devices could be on any surface of the interposer substrate 311, or arranged using the thickness of the substrate to provide, for example, solenoid inductors or capacitors formed with blind or through via techniques into the interposer substrate 311.

Figure 16:
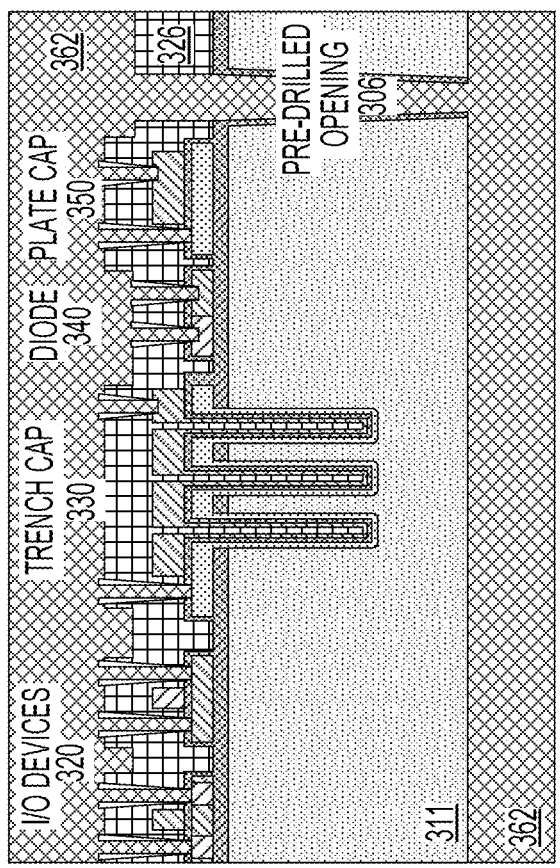
FIG. 16 shows a cross-sectional view of the predrilled interposer substrate of FIG. 15 after dielectric lamination according to one aspect of the disclosure.
Figure 17:
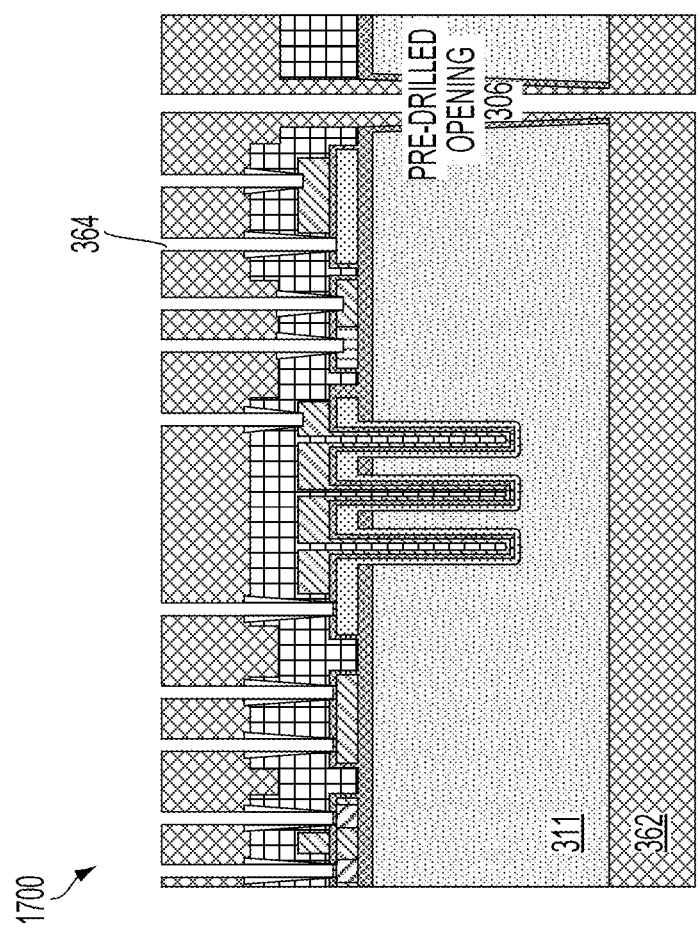
FIG. 17 shows a cross-sectional view of the predrilled interposer substrate of FIG. 16 after etching of the electric layer to reopen the contact layer and a through via opening according to one aspect of the disclosure.
Figure 18:
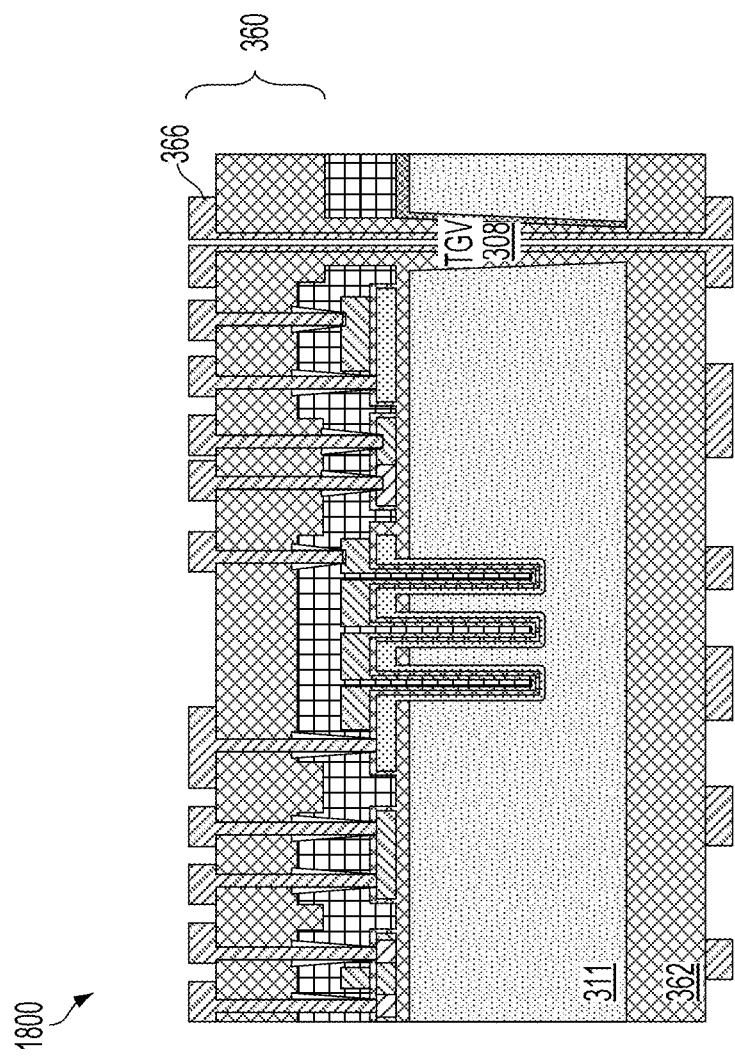
FIG. 18 shows a cross-sectional view illustrating the predrilled interposer substrate of FIG. 17 after conductive material plating of the opening in the contact layer and a via opening according to one aspect of the disclosure.

FIG. 16 is a cross-sectional view 1600 illustrating application of a dielectric layer 362 on the passivation layer 326 and a second surface of the interposer substrate 311. (See process blocks 434 and 436 of FIG. 4.) A conductive seed layer (e.g., copper) may be deposited over the contacts to facilitate via landing. FIG. 17 is a cross-sectional view 1700 illustrating opening of the dielectric layer 362 to expose the active and passive devices through the openings 364 and the predrilled opening 306. (See process blocks 440 and 442 of FIG. 4.) FIG. 18 is a cross-sectional view 1800 illustrating plating of a conductive material 366 (e.g., copper) within the openings 364 and the predrilled opening 306 to complete the contact layer 360 and the TGV 308. (See process block 436 to 442 of FIG. 4.)

Figure 19:
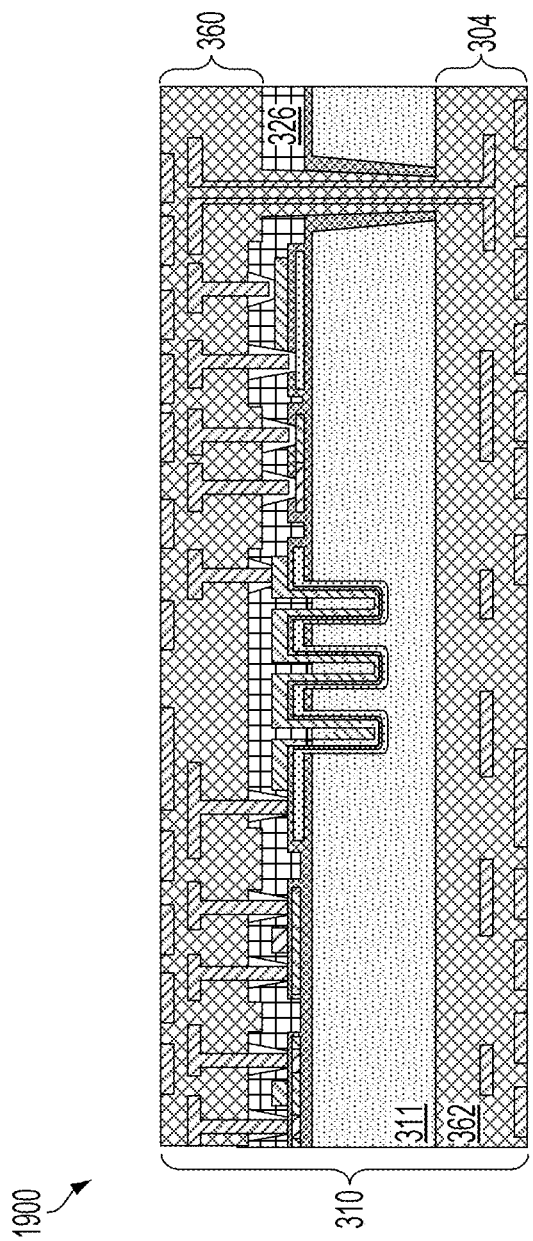
FIG. 19 shows a cross-sectional view of an integrated interposer including the predrilled interposer substrate of FIG. 18 after completion of the contact and interconnect layers according to one aspect of the disclosure.
Figure 20:
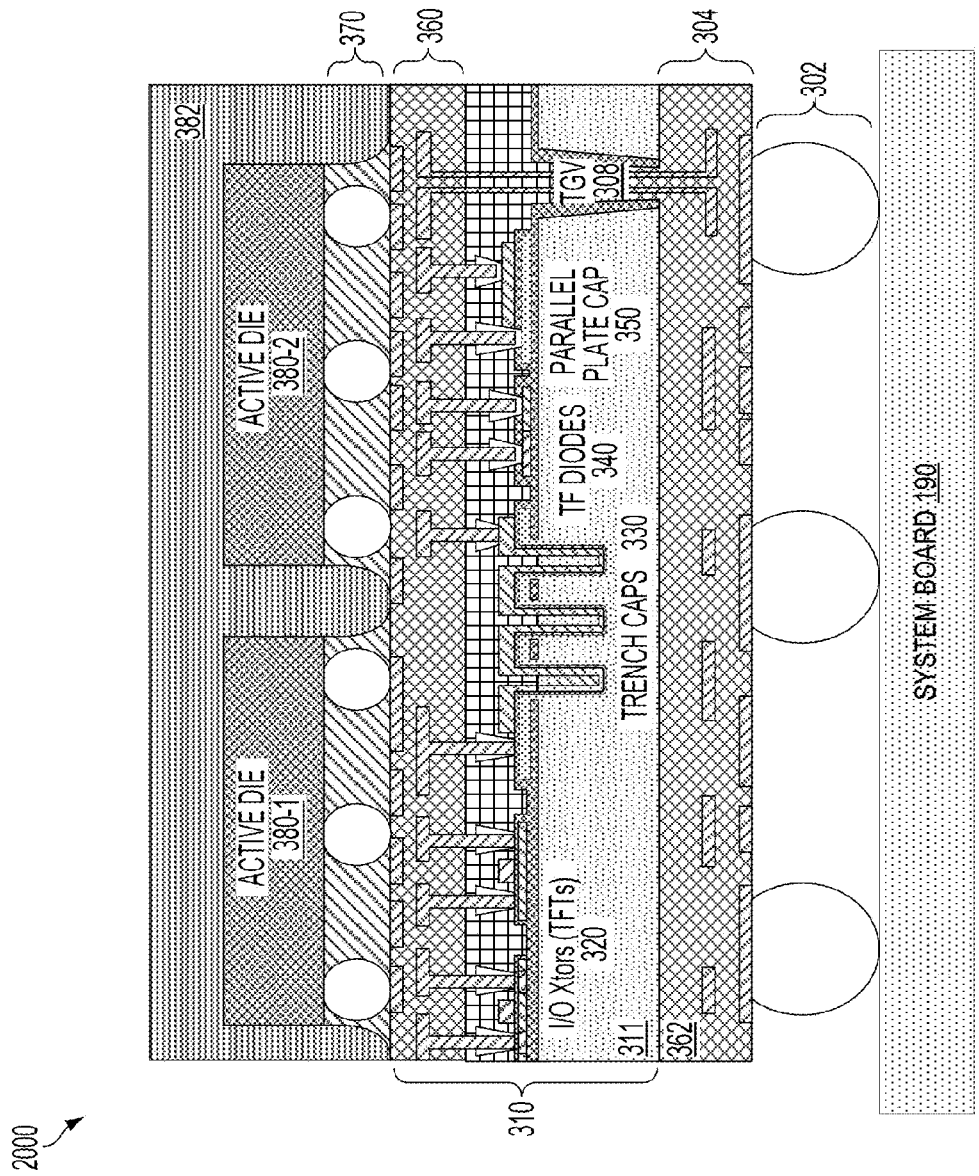
FIG. 20 shows a cross-sectional view of a system on chip including the integrated interposer of FIG. 19 according to one aspect of the disclosure.

FIG. 19 shows a cross-sectional view 1900 of the integrated interposer 310 after completion of the contact layer 360 and the interconnect layer 304 according to one aspect of the disclosure. The process for forming the contact layer is performed in process block 434 of FIG. 4. The contact layer 360 is coupled to an interconnect layer 304 through the TGV 308. In this configuration, a first set of interconnects 302 couples a system board (not shown) to the integrated interposer 310. In addition, the active die 380 are coupled to the integrated interposer 310 through a second set of interconnects 370. The process for completing formation of the SoC 300 is performed in process blocks 444 to 446 of FIG. 4. FIG. 20 shows a cross-sectional view 2000 of a SoC 300 including the integrated interposer 310 of FIG. 19 including over molding 382 according to one aspect of the disclosure.

Figure 6:
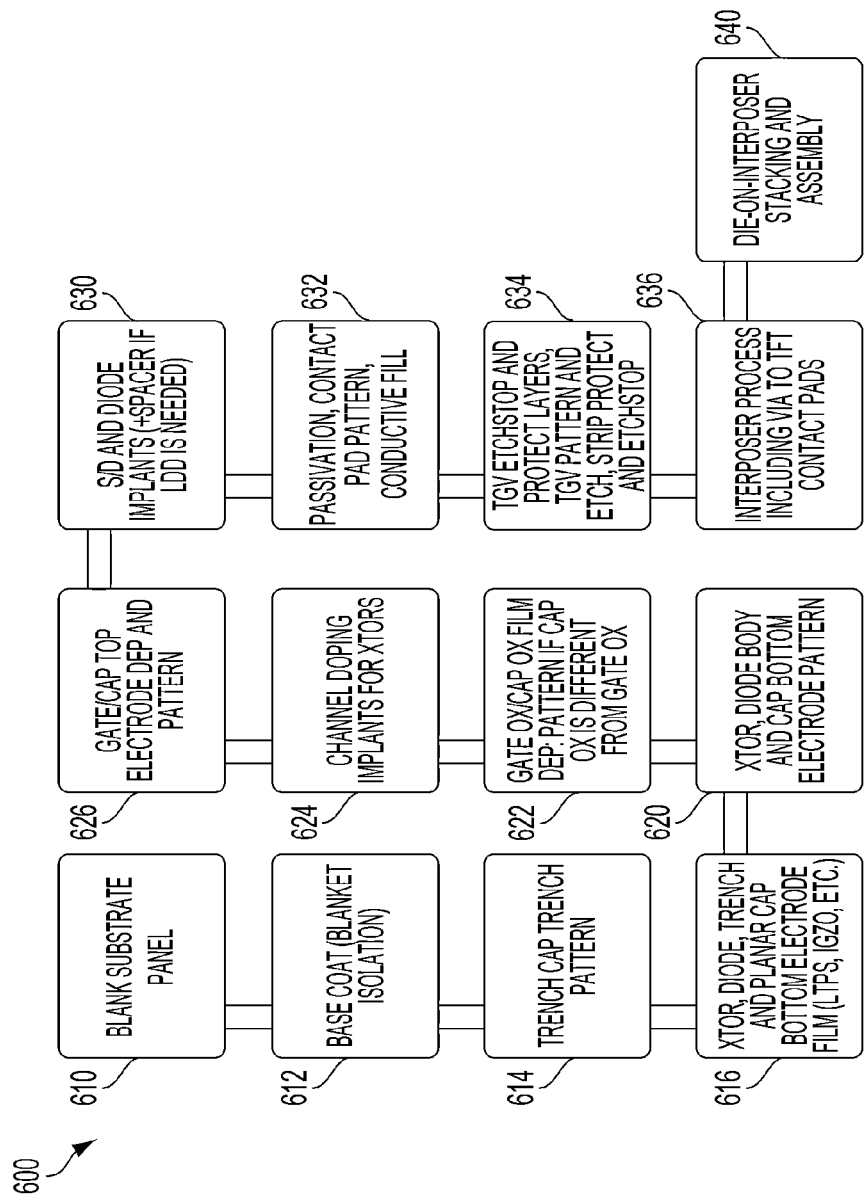
FIG. 6 is a block diagram illustrating a method for fabricating the integrated interposer of FIG. 5, according to one aspect of the disclosure.

FIG. 5 shows a cross-sectional view illustrating a SoC 500 including an integrated interposer 510 having thin film active devices and passive devices within an interposer substrate 511 of the integrated interposer 510 according to one aspect of the disclosure. FIG. 6 is a block diagram illustrating a method 600 for fabricating the SoC 500 and the integrated interposer 510 of FIG. 5, according to one aspect of the disclosure. This process is also further illustrated in FIGS. 21 to 25.

This configuration of the SoC 500 includes an interposer substrate 511 having passive devices (e.g., trench capacitors 530). At process block 610 of FIG. 6, a blank substrate panel (e.g., a glass panel) is provided. In contrast to the SoC 300 of FIG. 3, the interposer substrate 511, as shown in the cross-sectional view 2100 of FIG. 21, does not include a predrilled opening. The application of a base coat 512 on the interposer substrate 511 and the patterning of trench capacitor openings 532 within the interposer substrate 511 is performed in process blocks 612 and 614 of FIG. 6. The deposition of a thin film on the interposer substrate 511 is performed in process block 616 of FIG. 6. The patterning of the thin film on the interposer substrate 511 to form a patterned thin film 516 is performed in process block 620 of FIG. 6. The deposition of a gate oxide 522 is performed in process block 622 of FIG. 6.

FIG. 6 indicates that the optional implanting of the capacitor electrodes to form implanted electrodes 518 is performed in process block 624 of FIG. 6. In another configuration, the patterned thin film 516 may include the specified electrical properties without implanting. The deposition of gate electrodes, doping and etching of the gate oxide 522 is performed in process blocks 626 to 630 of FIG. 6.

Figure 21:
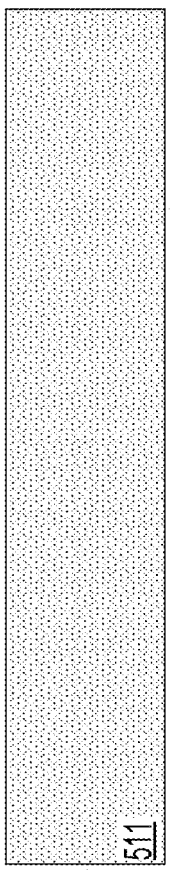
FIG. 21 shows a cross-sectional view illustrating the interposer substrate of FIG. 6 according to one aspect of the disclosure.
Figure 22:
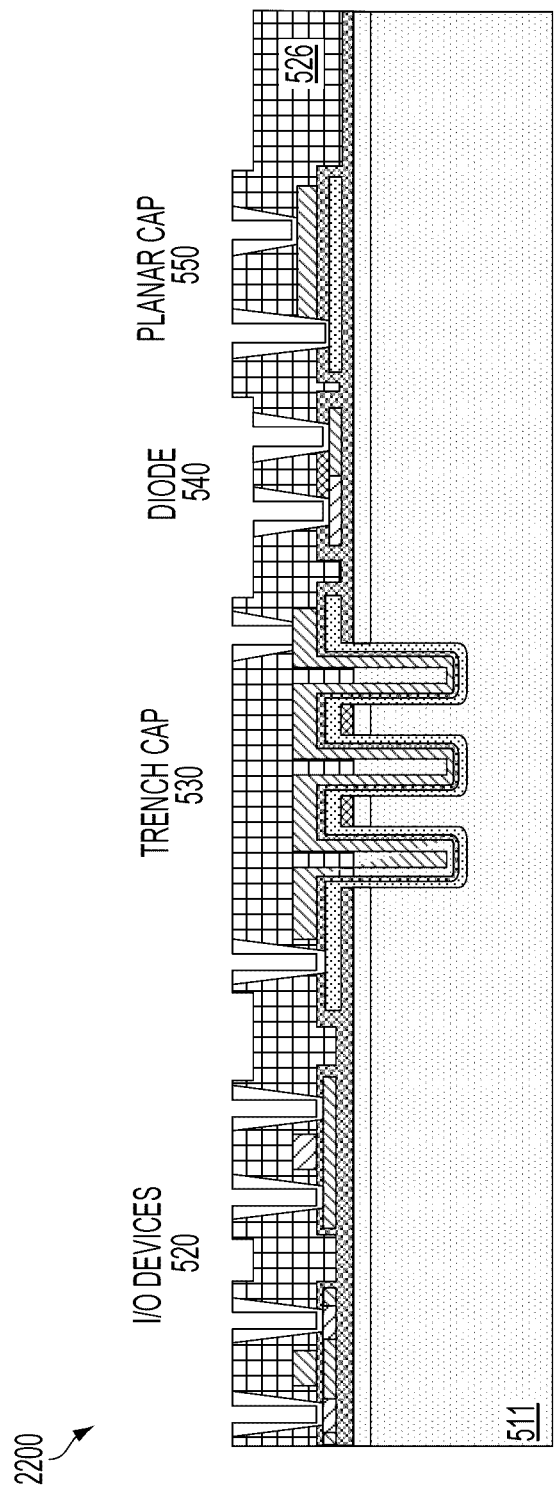
FIG. 22 shows a cross-sectional view illustrating the interposer substrate of FIG. 21 after passivation deposition and opening of a contact layer to active and passive devices embedded within the interposer substrate according to one aspect of the disclosure.

FIG. 22 shows a cross-sectional view 2200 illustrating the interposer substrate 511 of FIG. 21 after deposition of a passivation layer 526 and opening of a contact layer 560 to active and passive device embedded within the interposer substrate 511 according to one aspect of the disclosure. Representatively, deposition of the passivation layer 526 is performed on the interposer substrate 511 including the active devices (e.g., I/O transistors (Xtors) 520) and diodes 540. The passivation layer 526 also includes passive devices (e.g., trench capacitors 530 and parallel plate capacitor 550). (See process block 632 of FIG. 6.)

Figure 23:
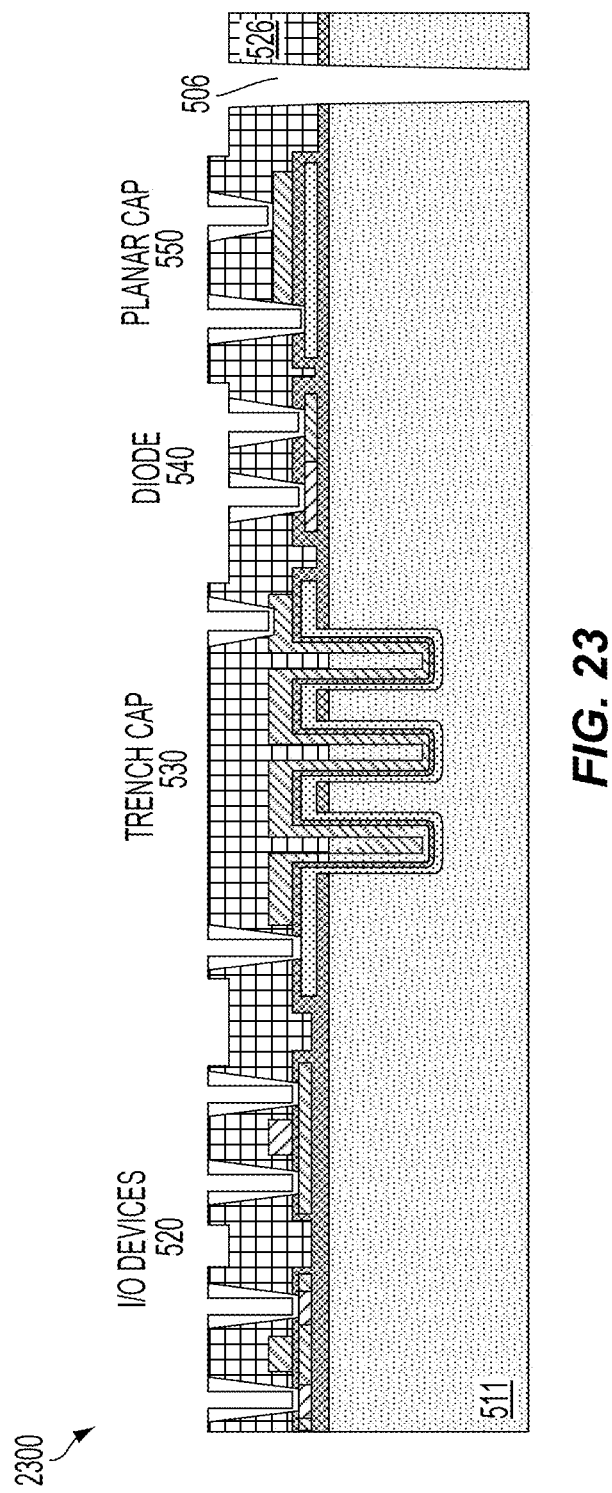
FIG. 23 shows a cross-sectional view illustrating the interposer substrate of FIG. 22 after drilling of a via opening and etching of the interposer substrate to expose the via opening according to one aspect of the disclosure.

FIG. 23 shows a cross-sectional view 2300 illustrating the interposer substrate 511 of FIG. 22 after drilling of a via opening 506 and etching of the interposer substrate 511 to expose the via opening 506 according to one aspect of the disclosure. In this configuration, an etch protect layer and/or a polymer layer may be deposited to protect the active and passive devices using, for example, chemical vapor deposition (CVD). In this arrangement, the interposer substrate 511 has an initial thickness of five-hundred (500) microns. After etching (e.g., hydrofluoric acid (HF) etching), the interposer substrate 511 is thinned to approximately one-hundred (100) to two-hundred (200) microns. This etch process may also be performed until the via opening 506 is exposed. (See process block 634 of FIG. 6.)

For example, a glass interposer substrate can be thinned by etching the glass to a desired thickness. The desired thickness of the glass may vary according to the targeted thickness for fabrication of, for example, thin film transistors (TFTs) (e.g., five-hundred (500) micron thickness). The interposer application, however, may target a fifty (100) to two-hundred fifty (250) microns thickness. In this arrangement, the glass interposer substrate is thinned, for example, through wet etching with etchants (e.g., hydrofluoric acid (HF)). Etch protect layers shield the devices during the glass thinning and any cleaning processes of the via formation. For example, a CVD etch protect layer provides intimate contact with the devices while providing good side wall coverages on device topology to prevent undesired etching and etchant attack on devices. During the thinning process, additional polymer layers may be used to provide additional protection beyond a CVD etch stop layer. Alternatively, the via formation on the thinned glass could be carried out by different laser or ablation processes according to aspects of the present disclosure.

Figure 24:
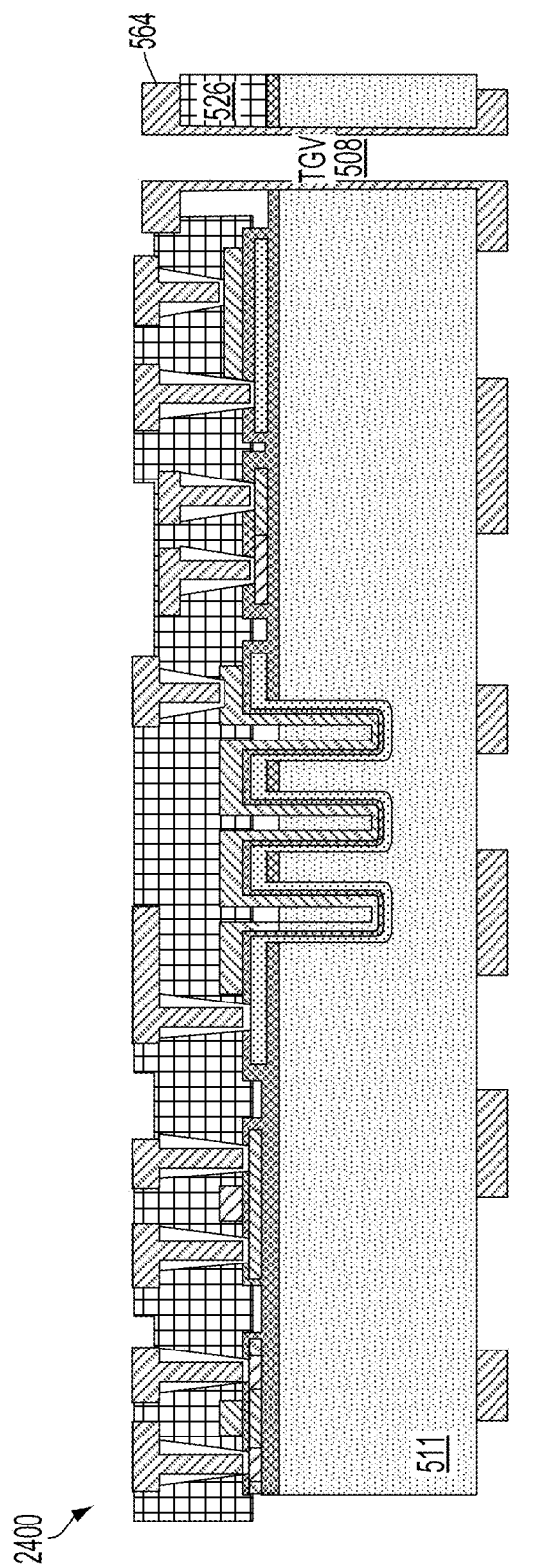
FIG. 24 shows a cross-sectional view illustrating the interposer substrate of FIG. 23 after conductive material plating of the opening in the contact layer and the via opening according to one aspect of the disclosure.

FIG. 24 shows a cross-sectional view 2400 illustrating the interposer substrate 511 of FIG. 23 after plating of a conductive material 564 in the openings of the contact layer 560 and the via opening 506 according to one aspect of the disclosure. The plating of the conductive material 564 (e.g., copper) within openings to the contact layer 560 and the via opening 506 completes the formation of the contact layer 560 and the TGV 508. (See process blocks 632 to 636 of FIG. 6.) Alternatively, a seed layer may be formed prior to plating, with the seed layer formed by a vacuum process (e.g., sputter deposition). An adhesion layer of titanium, chromium or similar metallurgy may be deposited, followed by plating a seed layer of, for example, copper. In some cases electro-less copper can be deposited to form the seed layer for electrolytic copper plating.

Figure 25:
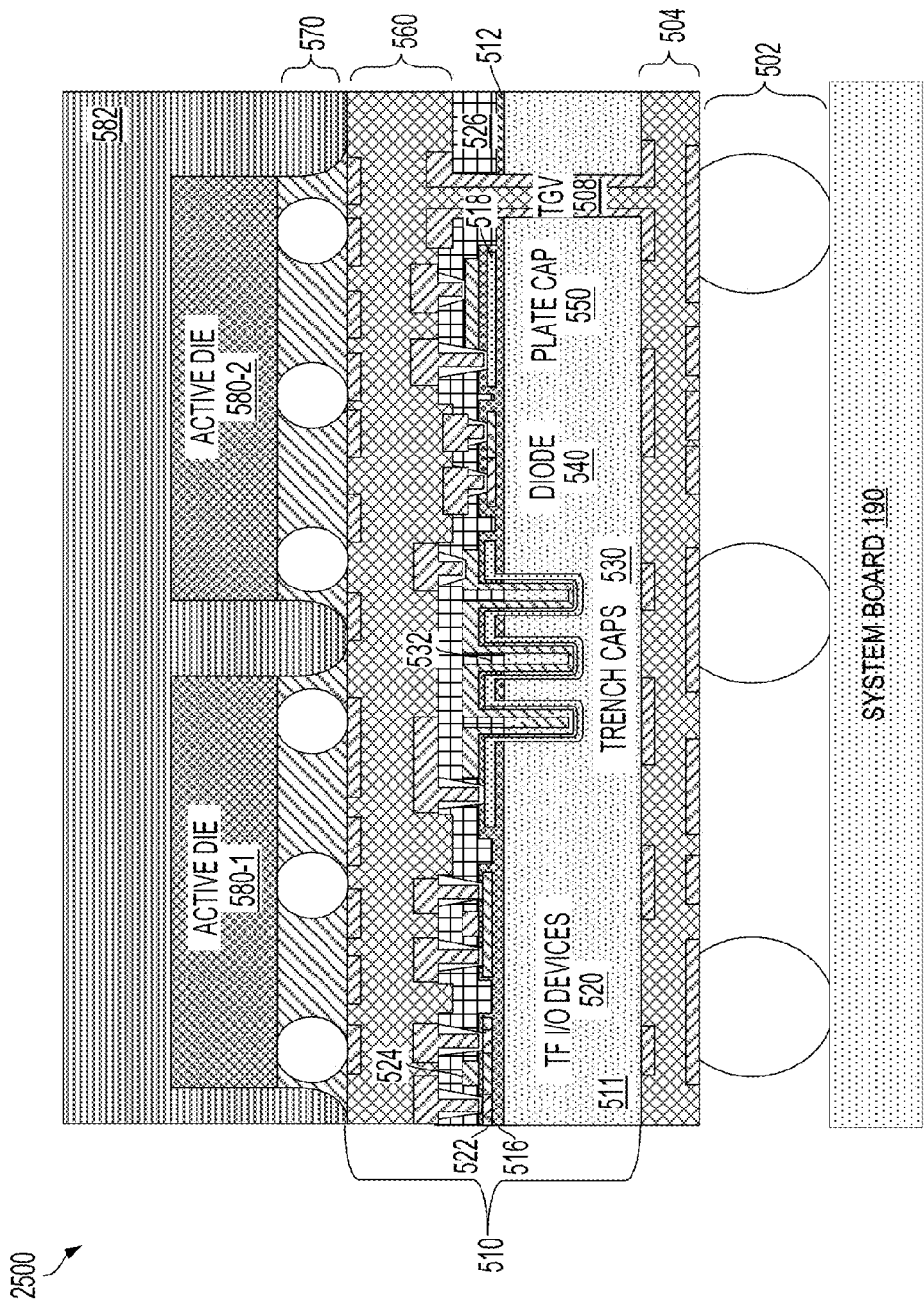
FIG. 25 shows a cross-sectional view of the system on chip including the integrated interposer of FIG. 24 according to one aspect of the disclosure.

FIG. 25 shows a cross-sectional view of a SoC 2500 including the integrated interposer 510 of FIG. 24 according to one aspect of the disclosure. In this configuration, the integrated interposer 510 is shown after completion of the contact layer 560 and the interconnect layer 504. The process for forming the contact layer is performed in process block 632. The contact layer 560 is coupled to the interconnect layer 504 through the TGV 508. A first set of interconnects 502 may couple a system board 190 to the integrated interposer 510. In addition, active die 580 (580-1, 580-2) are coupled to the integrated interposer 510 through a second set of interconnects 570. The process for completing formation of the SoC 2500 is performed in process blocks 640 to 646. In this arrangement, the SoC 2500 includes over molding 582 on the active die 580.

In this aspect of the present disclosure, the interposer substrate 511 has thermal and/or mechanical properties with values lying between the thermal and/or mechanical properties of the active die 580 the system board 190. The interposer substrate 511 can be composed of glass, quartz, organic, or other like material. The thermal and/or mechanical properties are tunable in this configuration.

Figure 26:
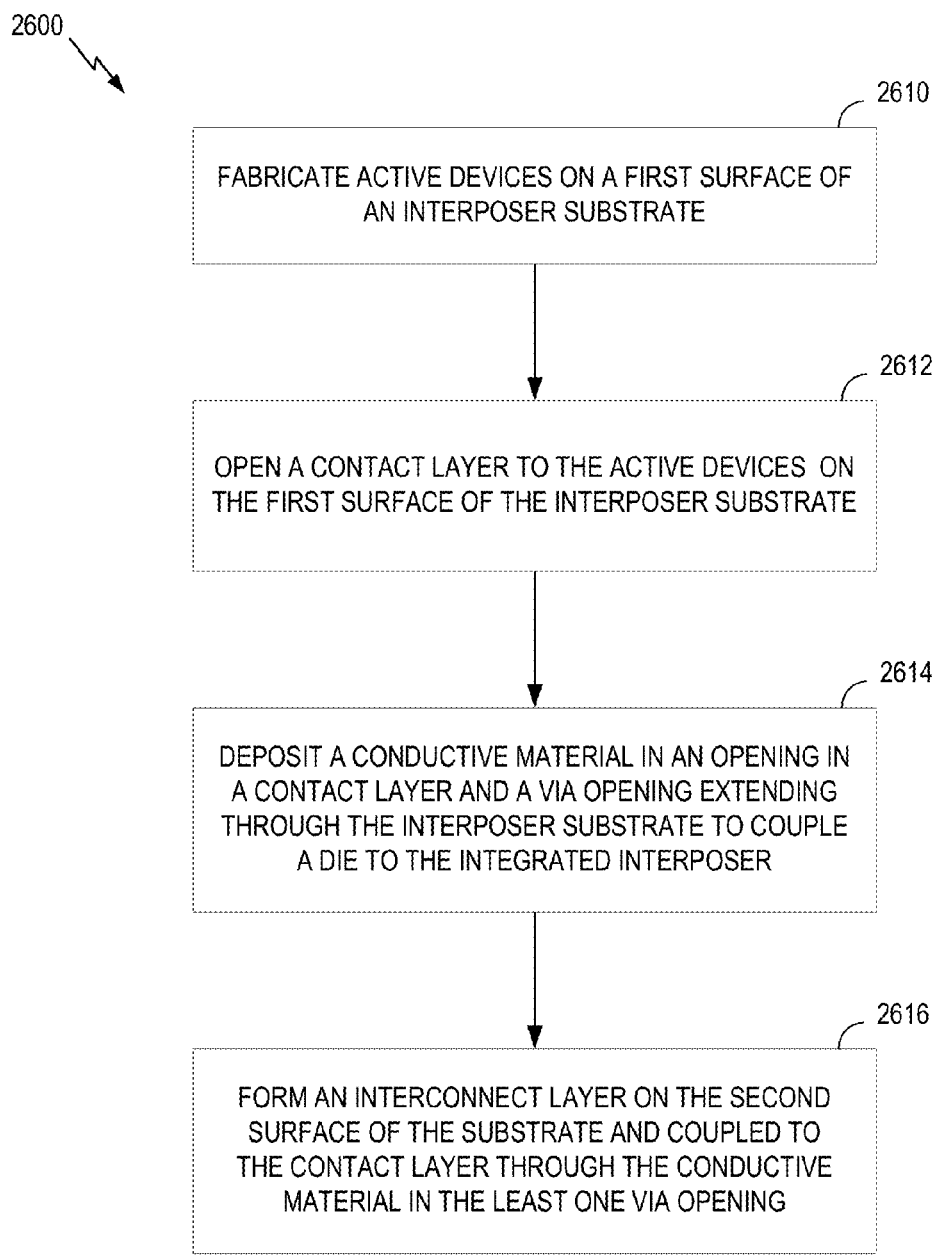
FIG. 26 is a flow diagram illustrating a method for fabricating the integrated interposer according to one aspect of the disclosure.

FIG. 26 is a flow diagram illustrating a method 2600 for fabricating the integrated interposer according to one aspect of the disclosure. At block 2610, active devices are fabricated on a first surface of an interposer substrate, for example, as shown in FIGS. 15 and 22. Although the present description has mentioned silicon and glass interposer substrates, other substrate materials including sapphire or other like materials are also contemplated. At block 2612, a contact layer is opened to the active devices on the first surface of the interposer substrate, for example, as shown in FIG. 17.

Referring again to FIG. 26, at block 2614, a conductive material is plated in the openings in the contact layer and a via opening on the first surface of the interposer substrate and extending through the interposer substrate to a second surface of the interposer, as shown in FIGS. 18 and 24. In this configuration, the contact layer enables coupling of a die to the integrated interposer through one or more interconnects, for example, as shown in FIGS. 1, 3, 5, 20 and 25. At block 2616, an interconnect layer is formed on the second surface of the interposer substrate and coupled to the contact layer through the conductive material in the via opening(s). For example, as shown in FIG. 1, the through via 106 couples the redistribution layer 104 to the contact layer 160. In this configuration, active die 180 are coupled to the integrated interposer 110 through a second set of interconnects 170. In addition, a first set of interconnects 102 may couple a system board 190 to the integrated interposer 110 through the redistribution layer 104.

Although the present description has mentioned a copper filler, other filler materials are also contemplated. For example, the via filler may be plated copper or copper paste. Alternatively, the via may be partially filled with copper plating followed by a polymer fill. The via may be partially filled with copper plating followed by a copper paste. In addition, other conductive metallurgies (e.g., gold (Ag)) may be used in place of copper. As shown in FIG. 1, an optional redistribution layer (RDL) process can be performed to couple the system board 190 to the integrated interposer 110 through the redistribution layer 104. Copper plating in the via may also be used for the redistribution layer. In other configurations, an interconnect layer 304/504 may couple the system board 190 to the integrated interposer 110 through interconnects 302/502.

In one configuration, an integrated interposer 110 includes active devices on a first surface of an interposer substrate. The integrated interposer 110 also includes a contact layer coupled to the active devices and configured to couple a die to the integrated interposer. The integrated interposer 110 further includes an interconnect layer on a second surface of the interposer substrate. The integrated interposer 110 also includes a means for coupling the contact layer through the interposer substrate to the interconnect layer on the second surface of the interposer substrate. In one aspect of the disclosure, the conducting means is the through via 108/308/508 of FIGS. 1, 3 and/or 5, configured to perform the functions recited by the conducting means. In another aspect, the aforementioned means may be a device or any layer configured to perform the functions recited by the aforementioned means.

Figure 27:
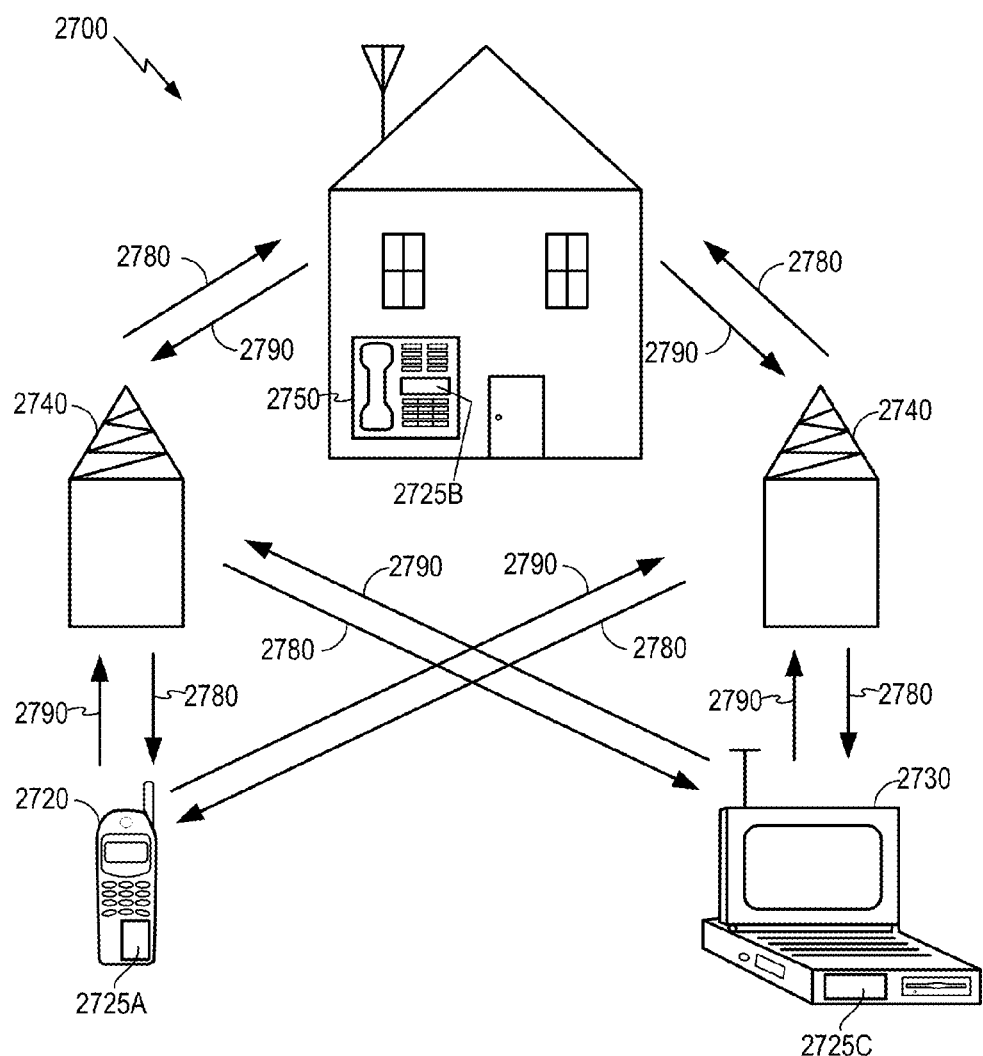
FIG. 27 is a block diagram showing a wireless communication system in which a configuration of the disclosure may be advantageously employed.

FIG. 27 is a block diagram showing an exemplary wireless communication system 2700 in which a configuration of the disclosure may be advantageously employed. For purposes of illustration, FIG. 27 shows three remote units 2720, 2730, and 2750 and two base stations 2740. It will be recognized that wireless communication systems may have many more remote units and base stations. Remote units 2720, 2730, and 2750 include IC devices 2725A, 2725B, and 2725C, which include the disclosed integrated interposer. It will be recognized that any device containing an IC may also include the disclosed integrated interposer, including the base stations, switching devices, and network equipment. FIG. 27 shows forward link signals 2780 from the base station 2740 to the remote units 2720, 2730, and 2750 and reverse link signals 2790 from the remote units 2720, 2730, and 2750 to base stations 2740.

In FIG. 27, remote unit 2720 is shown as a mobile telephone, remote unit 2730 is shown as a portable computer, and remote unit 2750 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof. Although FIG. 27 illustrates IC devices 2725A, 2725B, and 2725C, which include the disclosed integrated interposer, the disclosure is not limited to these exemplary illustrated units. Aspects of the present disclosure may be suitably employed in any device, which includes an interposer.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory and executed by a processor unit. Memory may be implemented within the processor unit or external to the processor unit. As used herein the term "memory" refers to any type of long term, short term, volatile, nonvolatile, or other memory and is not to be limited to any particular type of memory or number of memories, or type of media upon which memory is stored.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated interposer comprising:
   a glass interposer substrate;
   a plurality of active devices on an isolation layer on a first surface of the glass interposer substrate;
   a contact layer coupled to the plurality of active devices and configured to couple at least a first active die and a second active die to the integrated interposer;
   at least one through glass via coupled to the contact layer and extending through the glass interposer substrate to a second surface of the glass interposer substrate, the at least one through glass via being conical in shape and having a wider portion adjacent to the contact layer and a narrower portion adjacent to the second surface of the glass interposer substrate;
   at least one via concentric to and extending through the at least one through glass via; and
   an interconnect layer on the second surface of the glass interposer substrate and coupled to the at least one through glass via, the interconnect layer configured to couple a package substrate to the integrated interposer.

2. The integrated interposer of claim 1, further comprising a plurality of passive devices on the first surface of the glass interposer substrate.

3. The integrated interposer of claim 1, further comprising a plurality of interconnects to couple at least one of the first active die and the second active die to the contact layer of the integrated interposer.

4. The integrated interposer of claim 1, in which the plurality of active devices comprises thin film transistors (TFTs).

5. The integrated interposer of claim 4, in which the thin film transistors comprise input/output (I/O) TFTs arranged on the glass interposer substrate of the integrated interposer to provide I/O for at least one of the first active die and the second active die.

6. The integrated interposer of claim 1, in which the plurality of active devices comprises thin film diodes arranged with at least one passive device on the glass interposer substrate of the integrated interposer to provide electrostatic discharge (ESD) protection for at least one of the first active die and the second active die.

7. The integrated interposer of claim 1, in which the interconnect layer comprises a redistribution layer, the integrated interposer further comprising a plurality of interconnects to couple a system board to the integrated interposer.

8. The integrated interposer of claim 1 integrated into a mobile phone, a set top box, a music player, a video player, an entertainment unit, a navigation device, a computer, a hand-held personal communication systems (PCS) unit, a portable data unit, and/or a fixed location data unit.

9. An integrated interposer comprising:
a glass interposer substrate;
a plurality of active devices on an isolation layer on a first surface of the glass interposer substrate;
a contact layer coupled to the plurality of active devices and configured to couple at least a first active die and a second active die to the integrated interposer;
an interconnect layer on a second surface of the glass interposer substrate, the interconnect layer configured to couple a package substrate to the integrated interposer; and
means for coupling the contact layer through the glass interposer substrate to the interconnect layer on the second surface of the glass interposer substrate, the means for coupling being conical in shape and having a wider portion adjacent to the contact layer and a narrower portion adjacent to the second surface of the glass interposer substrate, and including at least one via concentric to and extending through the means for coupling.

10. The integrated interposer of claim 9, further comprising a plurality of passive devices on the first surface of the glass interposer substrate.

11. The integrated interposer of claim 9, further comprising a plurality of interconnects to couple at least one of the first active die and the second active die to the contact layer of the integrated interposer.

12. The integrated interposer of claim 9, in which the plurality of active devices comprises thin film transistors (TFTs).

13. The integrated interposer of claim 12, in which the thin film transistors comprise input/output (I/O) TFTs arranged on the glass interposer substrate of the integrated interposer to provide I/O for at least one active die.

14. The integrated interposer of claim 9, in which the plurality of active devices comprises thin film diodes arranged with at least one passive device on the glass interposer substrate of the integrated interposer to provide electrostatic discharge (ESD) protection for at least one of the first active die and the second active die.

15. The integrated interposer of claim 9, in which the interconnect layer comprises a redistribution layer, the integrated interposer further comprising a plurality of interconnects to couple a system board to the integrated interposer.

16. The integrated interposer of claim 9 integrated into a mobile phone, a set top box, a music player, a video player, an entertainment unit, a navigation device, a computer, a hand-held personal communication systems (PCS) unit, a portable data unit, and/or a fixed location data unit.

* * * * *